United States Patent [19]

Melton et al.

[11] Patent Number: 5,229,070
[45] Date of Patent: Jul. 20, 1993

[54] LOW TEMPERATURE-WETTING TIN-BASE SOLDER PASTE

[75] Inventors: Cynthia M. Melton, Bolingbrook; Andrew Skipor, Glendale Heights; William M. Beckenbaugh, Barrington, all of Ill.

[73] Assignee: Motorola, Inc., Schaumburg, Ill.

[21] Appl. No.: 908,109

[22] Filed: Jul. 2, 1992

[51] Int. Cl.$^5$ .............................................. B23K 35/34
[52] U.S. Cl. ..................................... 420/557; 148/24; 228/207; 420/559
[58] Field of Search ................ 420/557, 559; 228/207; 148/24

[56] References Cited

U.S. PATENT DOCUMENTS 4,797,328  1/1989  Boehm ................. 420/557

OTHER PUBLICATIONS

American Society for Metals, "Welding, Brazing and Soldering," *Metals Handbook*, 9th Edition, vol. 6 (1983) pp. 1069–1101.

*Primary Examiner*—Peter D. Rosenberg
*Attorney, Agent, or Firm*—Douglas D. Fekete; Donald B. Southard

[57] ABSTRACT

A low temperature-wetting solder paste for forming a tin-base solder connection comprises a mixture of compositionally distinct first and second solder powders. The first solder is formed predominantly of tin, preferably at least 90 weight percent. The second powder is formed of a tin alloy containing indium or bismuth and having a melting temperature less than the first powder. During soldering, the second powder melts during the early stages of the heating cycle to initiate wetting of the faying surfaces and promote dissolution of the first powder, thereby reducing the time and temperature required to form the solder connection.

17 Claims, No Drawings

LOW TEMPERATURE-WETTING TIN-BASE SOLDER PASTE

BACKGROUND OF THE INVENTION

This invention relates to a lead-free tin-base solder derived by melting a paste comprising a mixture of tin-bearing powders. More particularly, this invention relates to a paste that includes a powder formed of a relatively low melting tin alloy such that, upon heating during soldering operations, the alloy powder initially melts to wet the faying surface prior to melting of the bulk powder.

Solder pastes are employed to form a solder joint, for example, in physically and electrically connecting components of a microelectronic package. A typical paste comprises a powder formed of a solder alloy and dispersed in a liquid vehicle that contains a flux. One advantage of the paste is that it may be conveniently applied to the faying surface, for example, by screen printing. After the faying surfaces are arranged in contact with the paste, the arrangement is heated to melt the solder powder, whereupon the molten solder coalesces to form a liquid body sufficient to complete the connection. In order to obtain a strong bond, it is essential that the molten alloy flow in intimate contact onto the faying surfaces, which phenomenon is referred to as wetting. Wetting is enhanced by the flux, which reacts to remove oxides from the metal surfaces, particularly the faying surfaces. In a typical soldering step, fluxing occurs during the early stages of heating, so that the molten solder may readily flow onto the faying surfaces. Nevertheless, the time for heating must necessarily be sufficient to not only melt the solder powder, but also to permit fluxing and wetting to be completed.

Common solder paste includes a powder composed of a tin-lead alloy. During heating, the tin-lead alloy forms a eutectic liquid at a relatively low temperature. In order to accelerate heat transfer to the solder powder and thereby minimize the time at the elevated temperature, the assembly is typically exposed to an oven temperature that is as much as 40° C. to 60° C. above the solder melting point. Pastes are also available that contain a lead-free tin-base solder. In comparison to tin-lead solder, lead-free, predominantly tin solders tend to melt at relatively higher temperatures. Overheating significantly above the melting point, such as employed for tin-lead solder, tends to adversely affect other features of an electronic component package. It is also known to form a solder of an indium-tin or bismuth-tin alloy to take advantage of low melting eutectic phases. However, such low temperature solder is not adequate to withstand temperatures experienced during typical microelectronic applications. Thus, there is a need for a lead-free tin-base solder that permits soldering to be completed at a temperature suitable to avoid damage to microelectronic components, that minimizes the time required to melt the solder paste and wet the faying surfaces, and further that produces a solder joint that maintains its integrity despite temperature excursions of the type experienced by microelectronic packages during use.

SUMMARY OF THE INVENTION

This invention contemplates a solder paste that includes a mixture of compositionally distinct first and second solder powders, and a method utilizing the paste for forming a tin-base solder connection. The first powder is formed of predominantly tin. The second powder is composed of a tin alloy containing indium or bismuth and having a melting temperature less than the melting temperature of the first powder. During heating in contact with the faying surfaces, the tin alloy powder commences to melt to form a liquid phase that initiates wetting of the faying surfaces and dissolves tin from the first powder. Thereafter, the assembly is heated to a higher temperature to complete liquification of the first powder whereupon the constituent metals mix to form a uniform composition wherein the alloying agent of the second powder constitutes but a minor concentration. Following cooling to solidify the solder, the resulting joint is able to withstand temperature excursions of the type experienced, for example, by typical microelectronic components during normal operation. Nevertheless, incorporation of the low melting tin alloy as a distinct constituent in the powder mixture results in formation of a significant liquid phase during the early stages of heating to accelerate wetting of the faying surfaces and liquification of the tin-rich powder to reduce the time and temperature required for the heating cycle.

DETAILED DESCRIPTION OF A PREFERRED EMBODIMENT

In a preferred embodiment, a solder paste in accordance with this invention is employed to form a lead-free tin-base solder connection for mounting an electrical component onto a printed circuit board. The paste forms a solder connection that physically attaches and electrically connect a copper lead of the component and a copper trace on the board.

A preferred paste in accordance with this invention was formulated by blending commercially available pastes containing the individual solder powders for the desired mixture. A first, tin-rich solder powder consisted of about 3.5 weight percent silver and the balance tin and sized between −200 and +325 mesh. The powder was obtained in a paste comprising a solvent composed of high boiling alcohols and glycol and containing a flux comprising white rosin compound, an ethoxylated amide compound and a fatty amide compounds, which paste was commercially available from Kester Solder Division of Litton Systems, Inc. under the trade designation 247 B. A second, tin-indium alloy powder consisted of about 50 weight percent indium and the balance tin. The powder was sized to between −200 and +325 mesh, and was obtained in a paste in which the powder was dispersed in a solvent composed of ethylene glycol and methanol and containing a modified rosin flux, which paste was obtained commercially from the Indium Corporation of America under the trade designation RMAF. The pastes containing the individual powders were mixed to form a compound paste containing a mixture consisting of between about 10 and 20 weight percent indium alloy powder and the balance tin-silver powder, which mixture was dispersed in a liquid vehicle composed of a blend of the vehicles of the individual pastes.

The compound paste was dispersed onto a faying surface of the copper trace. The component was assembled with the board such that the faying surface of the component was also in contact with the paste. The assembly was then loaded into an oven and heated gradually at a rate of between about 2° and 3° C. per second to a maximum temperature of about 220° C. The heating cycle included heating above 195° C., estimated to be the melting temperature of the resultant tin-indium-silver alloy, for a period of about 30 seconds. During heating, the vehicle vaporized, and the flux was activated to remove oxide contamination from the surfaces, including the faying surfaces and the solder powder. Also, the solder powder melted to produce a liquid phase of uniform composition. The assembly was then removed from the oven and cooled, whereupon the solder body solidified to form the desired joint bonding the faying surfaces into an integral structure.

Thus, this invention provides a solder paste that is based upon a mixture of a first, high melting, predominantly tin powder and a second, lower melting, tin alloy powder. The tin alloy preferably has a melting temperature significantly less than the melting temperature of the predominantly tin powder. More preferably, the liquidus temperature of the tin alloy powder is preferably less than the solidus temperature of the predominantly tin powder, so that the second powder substantially melts during the initial stages of the heating cycle. As used herein, the liquidus temperature refers to the temperature above which the metal exists solely as a liquid phase, as opposed to the solidus temperature below which the metal exists solely as a solid phase and above which the metal forms a liquid phase that coexists with a solid phase. While not wishing to be limited to any particular theory, it is believed that, under the non-equilibrium conditions that exist during heating, the addition of a distinct, low melting powder facilitates formation of a coalesced liquid phase during the early stages of heating. This liquid phase, which is formed by solder alloy, wets the faying surfaces, assuring this essential step of the soldering process. As the temperature increases, tin from the high melting solder powder dissolves into the liquid phase, which is enhanced by the higher chemical activity of the liquid and the extended liquid-solid contact. The heating cycle is continued to complete liquification of the first powder. This results in a singular liquid phase in which the constituents interfuse to produce a uniform composition. Accordingly, the heating cycle extends at least above the melting temperature of the product alloy. However, the early wetting and enhanced tin dissolution not only reduces the maximum temperature required to complete melting, but also reduces the time during which the assembly needs to be maintained above the product alloy melting point. Thus, for the tin indium alloy in the embodiment that contains silver, melting was completed by heating above about 195° C. for longer than about 15 seconds. The alloying agent of the second powder has a relatively small concentration in the product alloy. Thus, the mechanical properties of the resulting solder alloy are attributed mainly to the tin metal of the major powder. These properties include enhanced integrity at high temperatures within the range typical of microelectronic package operation.

In general, the powder mixture utilized for the paste is formed mainly of predominantly tin powder. Preferably, the powder is composed of at least about 90 weight percent tin and is substantially free of lead and of the alloying agent utilized in the low melting powder, that is, indium or bismuth. A preferred solder consists of less than about 5 weight percent silver and the balance tin. The high melting solder preferably forms at least 80 weight percent of the total powder.

In accordance with this invention, the paste also includes a second, low melting solder powder formed of a lead-free tin alloy that contains indium or bismuth. Metallic indium wets copper at a relatively slow rate. Thus, the second powder is based upon a tin alloy to accelerate wetting. On the other hand, the presence of a high indium content in the liquid phase that initially wets the copper reduces the formation of intermetallic copper compounds. Indium and tin form a low melting eutectic composition composed of about 49.1 weight percent tin and the balance indium and having a melting point of about 120° C. A preferred powder contains a near-eutectic alloy comprising between about 40 and 60 weight percent indium. Within this range, hypereutectic alloys are desired to permit liquification of the second powder without requiring dissolution of tin from the first powder. Similarly, bismuth forms a low melting eutectic composition consisting of about 58 weight percent bismuth and the balance tin and having a melting point of about 138° C., and is utilized as a near eutectic or slightly hypereutectic alloy. It is desired to select the composition and proportion of low-melting solder powder to achieve a low concentration of the alloying agent indium or bismuth in the product solder, preferably less than about 8 weight percent. Thus, upon solidification, the alloying agent is dispersed within the solder body. This permits the overall integrity of the joint to be maintained during usage despite brief temperature excursions above the eutectic melting temperature.

In addition to forming a connection within a microelectronic assembly, this invention may be utilized to form lead-free joints in other applications. Although in the described embodiment, the faying surfaces were formed of base copper, the surfaces may be suitably formed of any solder-wettable material and may be pre-tinned to further enhance wetting.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A low temperature-wetting tin-base solder paste comprising a mixture of a first and a second solder powder, said first powder being formed of a predominantly tin metal having a first melting temperature, said second powder being formed of a tin alloy containing a metal selected from the group consisting of indium and bismuth and having a melting temperature less than the first melting temperature.

2. A paste in accordance with claim 1 wherein the first powder is substantially lead-free and is composed of at least about 90 weight percent tin.

3. A paste in accordance with claim 1 wherein the second powder is formed of a lead-free alloy comprising between about 40 and 60 weight percent indium and the balance tin.

4. A paste in accordance with claim 1 wherein the mixture comprises between about 10 and 20 weight percent of the second powder.

5. A low temperature-wetting tin-base solder paste comprising a liquid vehicle and a mixture of solder powders suspended in the vehicle, said mixture comprising a major portion of a first lead-free tin-rich solder powder and a minor portion of a second tin alloy solder powder, said first powder being formed of a metal containing at least about 90 weight percent tin and having a solidus temperature, said second metal powder being formed of a lead-free tin alloy containing a metal selected from the group consisting of indium and bismuth and having a liquidus temperature less than the first powder solidus temperature.

6. A paste in accordance with claim 5 wherein first tin alloy consist of up to 5 weight percent silver and the balance tin.

7. A paste in accordance with claim 5 wherein the second alloy consists of about 40 to 60 weight percent indium and the balance tin.

8. A paste in accordance with claim 5 wherein vehicle includes a rosin flux compound.

9. A paste in accordance with claim 5 wherein mixture comprises at least 80 weight percent of the first powder.

10. A paste in accordance with claim 5 wherein mixture contains not more than 8 weight percent indium and bismuth.

11. A soldering process comprising
applying a tin-base solder paste to a faying surface, said paste comprising a mixture of a first and a second solder powder, said first powder being formed of a predominantly tin metal and having a first melting temperature, said second powder being formed of a tin alloy containing a metal selected from the group consisting of indium and bismuth and having a second melting temperature less than said first melting temperature,
heating the paste to a temperature above the second melting temperature to melt the second powder to form a liquid phase that initiates wetting of the faying surface, and
further heating the paste to a relatively higher temperature sufficient to melt the mixture, whereupon the first powder dissolves into the liquid phase, and
cooling the liquid phase in contact with the faying surface to form a solid solder body bonded to the faying surface.

12. A process in accordance with claim 11 wherein the first powder is formed of a lead-free alloy composed of at least about 90 weight percent tin.

13. A process in accordance with claim 11 wherein the second powder is formed of a lead-free alloy composed of about 40 to 60 weight percent indium and the balance tin.

14. A process in accordance with claim 11 wherein the powders are dispersed in a liquid vehicle comprising a rosin flux compound.

15. A process in accordance with claim 11 wherein the mixture comprises between about 10 and 20 weight percent of the second powder.

16. A lead-free soldering process comprising
applying a lead-free tin-base solder paste to a first copper faying surface, said paste comprising a liquid vehicle containing a rosin flux and a mixture of a high melting tin-base powder and a low melting solder powder dispersed in the vehicle, said high melting powder being composed of at least about 90 weight percent tin and having a first melting temperature, said second metal powder being formed of a tin alloy consisting essentially of between about 40 and 60 weight percent indium and the balance tin and having a second melting temperature less than said first melting temperature,
arranging a second copper faying surface in contact with the paste applied to the first surface to form an assembly,
heating the assembly to a temperature above the second melting temperature to activate the flux and to melt the low melting powder to form a liquid phase that wets the faying surfaces,
further heating the assembly to a relatively higher temperature and for a time effective to complete melting of the first powder and to form a liquid phase having a uniform composition, and
cooling the assembly to solidify the liquid phase to form a solid solder connection that bonds the faying surfaces into an integral structure.

17. A process in accordance with claim 16 wherein the mixture comprises between about 10 and 20 weight percent of the second powder and wherein the solder connection comprises not greater than 8 weight percent indium.

* * * * *